US011145707B2

United States Patent
Xu

(10) Patent No.: US 11,145,707 B2
(45) Date of Patent: *Oct. 12, 2021

(54) ORGANIC LIGHT EMITTING DIODE DISPLAY PANEL, TRACE STRUCTURE AND ORGANIC LIGHT EMITTING DIODE DISPLAY APPARATUS

(71) Applicant: Wuhan China Star Optoelectronics Semiconductor Display Technology Co., LTd., Wuhan (CN)

(72) Inventor: Kui Xu, Guangdong (CN)

(73) Assignee: WUHAN CHINA STAR OPOTELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

This patent is subject to a terminal disclaimer.

(21) Appl. No.: 16/868,641

(22) Filed: May 7, 2020

(65) Prior Publication Data

US 2020/0266261 A1 Aug. 20, 2020

Related U.S. Application Data

(63) Continuation of application No. 15/743,247, filed on Jan. 9, 2018, now Pat. No. 10,686,026.

(51) Int. Cl.
*H01L 27/32* (2006.01)
*H01L 51/52* (2006.01)
(Continued)

(52) U.S. Cl.
CPC ...... *H01L 27/3276* (2013.01); *H01L 27/3262* (2013.01); *H01L 51/0097* (2013.01);
(Continued)

(58) Field of Classification Search
None
See application file for complete search history.

(56) References Cited

U.S. PATENT DOCUMENTS 10,686,026 B2 * 6/2020 Xu ............ H01L 27/1218
2014/0138637 A1 * 5/2014 Yang ........... H01L 27/1218
257/40

(Continued)

FOREIGN PATENT DOCUMENTS

CN 104916260 A 9/2015
CN 105074802 A 11/2015
(Continued)

*Primary Examiner* — J. E. Schoenholtz
(74) *Attorney, Agent, or Firm* — Leong C. Lei

(57) ABSTRACT

Disclosed is a trace structure of an organic light emitting diode display panel, including an array substrate, wherein the trace structure of the organic light emitting diode display panel includes an outer lead region disposed on a substrate of the array substrate. Two metal trace layers which are mutually insulated are disposed on the outer lead region. A bending region is configured to the outer lead region. Traces of the two metal trace layers and a center line of the bending region are arranged with a non-orthogonal included angle and the metal trace layers connect the organic light emitting diode display panel with external electrical signals.

16 Claims, 3 Drawing Sheets

(51) Int. Cl.
*H01L 51/00* (2006.01)
*H01L 27/12* (2006.01)

(52) U.S. Cl.
CPC ........ *H01L 51/524* (2013.01); *H01L 51/5281* (2013.01); *H01L 27/1244* (2013.01); *H01L 2251/5338* (2013.01)

(56) References Cited

U.S. PATENT DOCUMENTS

| | | | |
|---|---|---|---|
| 2017/0077211 A1 | 3/2017 | Yamazaki et al. | |
| 2017/0179423 A1* | 6/2017 | Kwon | H01L 27/3276 |
| 2018/0138431 A1* | 5/2018 | Nishimura | H01L 27/3276 |
| 2018/0374912 A1* | 12/2018 | Zhang | H01L 51/5253 |

FOREIGN PATENT DOCUMENTS

| | | |
|---|---|---|
| CN | 105144270 A | 12/2015 |
| CN | 106773389 A | 5/2017 |
| CN | 107331686 A | 11/2017 |

\* cited by examiner

ORGANIC LIGHT EMITTING DIODE DISPLAY PANEL, TRACE STRUCTURE AND ORGANIC LIGHT EMITTING DIODE DISPLAY APPARATUS

CROSS REFERENCE

This is a continuation application of co-pending U.S. patent application Ser. No. 15/743,247 filed on Jan. 9, 2018, which is a national stage of PCT Application No. PCT/CN2017/112970, filed on Nov. 25, 2017, claiming foreign priority of Chinese Patent Application No. 2017105307151, entitled "Organic Light Emitting Diode Display Panel, Trace Structure and Organic Light Emitting Diode Display Apparatus", filed on Jun. 30, 2017, the disclosure of which is incorporated herein by reference in its entirety.

FIELD OF THE INVENTION

The present invention relates to a display panel field, and more particularly to a trace structure of an organic light emitting diode display panel, an organic light emitting diode display panel and an organic light emitting diode display device.

BACKGROUND OF THE INVENTION

At present, the mainstream technologies in the flat panel display industry are LCD (Liquid Crystal Display) and OLED (Organic Light-Emitting Diode). The OLED is more flexible than LCD and can diversify the display forms.

The TFT (thin film transistor) substrate of the OLED adopts a flexible board as a substrate to dispose TFTs. Then, the OLED light emitting layer, the TFT package layer, the polarizer and the glass cover plate are sequentially arranged on the TFT substrate. The outer lead region is arranged on the same side of the substrate where the TFT substrate is configured. The outer lead region is used to arrange the driving chip, the flexible circuit board for connection and to arrange the metal trace layers of the OLED light emitting layer and the chip circuit board. At present, the main way to realize the flexibility is to bend the portion of the substrate having the outer lead region to the back side of the entire TFT substrate. Accordingly, the metal trace layer must be bent, together. The metal trace layer after being bent is in a bent state and suffers a certain stress. The bending stress of the substrate is larger and the metal trace layer can be easily broken as being bent with the substrate, together.

SUMMARY OF THE INVENTION

The present invention provides a trace structure of an organic light emitting diode display panel to solve the technical problem that a metal trace layer is broken when an outer lead region is bent.

The present invention provides a trace structure of an organic light emitting diode display panel, comprising an array substrate, wherein the trace structure of the organic light emitting diode display panel comprises an outer lead region disposed on a substrate of the array substrate; wherein two metal trace layers which are mutually insulated are disposed on the outer lead region, a bending region is configured to the outer lead region, traces of the two metal trace layers and a center line of the bending region are arranged with a non-orthogonal included angle and the two metal trace layers connect the organic light emitting diode display panel with external electrical signals.

The two metal trace layers are arranged in a thickness direction of the organic light emitting diode display panel and are insulated by an insulation layer.

The array substrate comprises a TFT (thin film transistor) switch and a gate insulation layer formed on the substrate, wherein a first metal trace layer of the two metal trace layers is arranged on the gate insulation layer of the outer lead region, a second metal trace layer is arranged on the insulation layer covering the first metal trace layer of the outer lead region.

Projections of the traces of the two metal trace layers in the outer lead region intersect but not completely overlap and an intersecting position is at two sides of the center line of the bending region or on the center line of the bending region.

The present invention provides an organic light emitting diode display panel, comprising an array substrate, an outer lead region, an organic light emitting diode light emitting layer overlapped on the array substrate, a polarizer and a glass cover plate, and the array substrate comprises a substrate, wherein at least two metal trace layers which are mutually insulated are disposed on the outer lead region, a bending region is configured to the outer lead region, traces of the two metal trace layers and a center line of the bending region are arranged with a non-orthogonal included angle and the two metal trace layers connect the organic light emitting diode display panel with external electrical signals.

The two metal trace layers are arranged in a thickness direction of the organic light emitting diode display panel and are insulated by an insulation layer.

The array substrate comprises a TFT (thin film transistor) switch and a gate insulation layer formed on the substrate, wherein a first metal trace layer of the two metal trace layers is arranged on the gate insulation layer of the outer lead region, a second metal trace layer of the two metal trace layers is arranged on the insulation layer covering the first metal trace layer of the outer lead region.

Projections of the traces of the two metal trace layers in the outer lead region intersect but not completely overlap and an intersecting position is at two sides of the center line of the bending region or on the center line of the bending region.

The organic light emitting diode display device further comprises a flexible circuit board, wherein the flexible circuit board is connected to the outer lead region and is coupled to the organic light emitting diode display panel via the metal trace layers.

An OLED display device provided by the present invention comprises the OLED display panel.

As the outer lead region of the OLED display panel according to the present invention is bent toward the back side of the array substrate along the center line of the bending region, the included angle of the traces of the two metal trace layers and the center line of the bending region is a non-orthogonal angle. Thus, as the traces are bent with the substrate, the bent direction of the traces is inclined. Once the trace contact area is increased to reduce the stress of the unit length, the direct stress to the traces can be reduced, accordingly to solve the technical problem that the metal trace layer is broken when the outer lead region is bent.

BRIEF DESCRIPTION OF THE DRAWINGS

The structural features and effects of the present invention will be more clearly described, which will now be described in detail with reference to the accompanying drawings and specific embodiments.

DETAILED DESCRIPTION OF PREFERRED EMBODIMENTS

For better explaining the technical solution and the effect of the present invention, the present invention will be further described in detail with the accompanying drawings in the specific embodiments. The figures are for illustrative purposes only and are illustrative only but not to be construed as limiting the present application.

Figure 1:
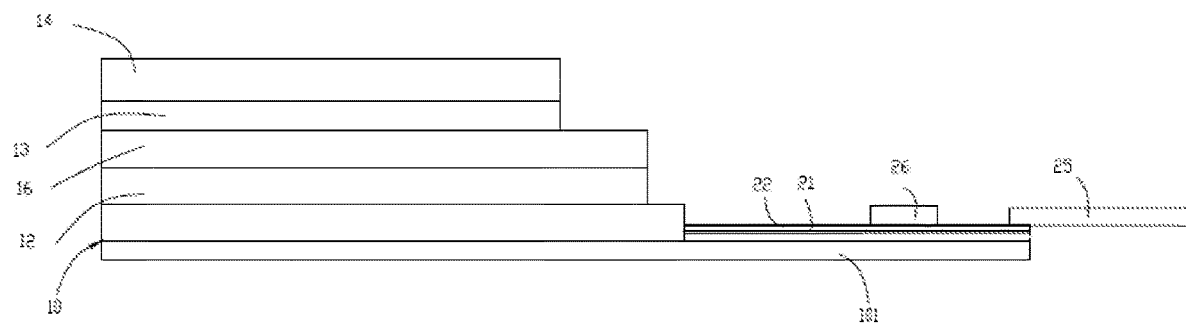
FIG. 1 is a lateral view diagram of a structure of an OLED display panel of the present invention.

Please refer to FIG. 1. The present invention provides a trace structure of an organic light emitting diode (OLED) display panel and an organic light emitting diode display panel. The trace structure of the organic light emitting diode display panel is applied on the organic light emitting diode display panel to provide traces for connection of the OLED display panel and external electrical signals. The OLED display panel comprises an array substrate 10, an OLED light emitting layer 12 overlapped on the array substrate 10, a polarizer 13 and a glass cover plate 14. The array substrate 10 comprises a substrate 101.

Figure 2:
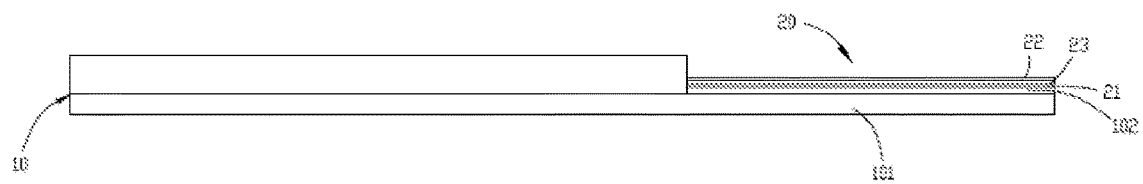
FIG. 2 is a lateral view diagram of a trace structure of an OLED display panel of the present invention.
Figure 3:
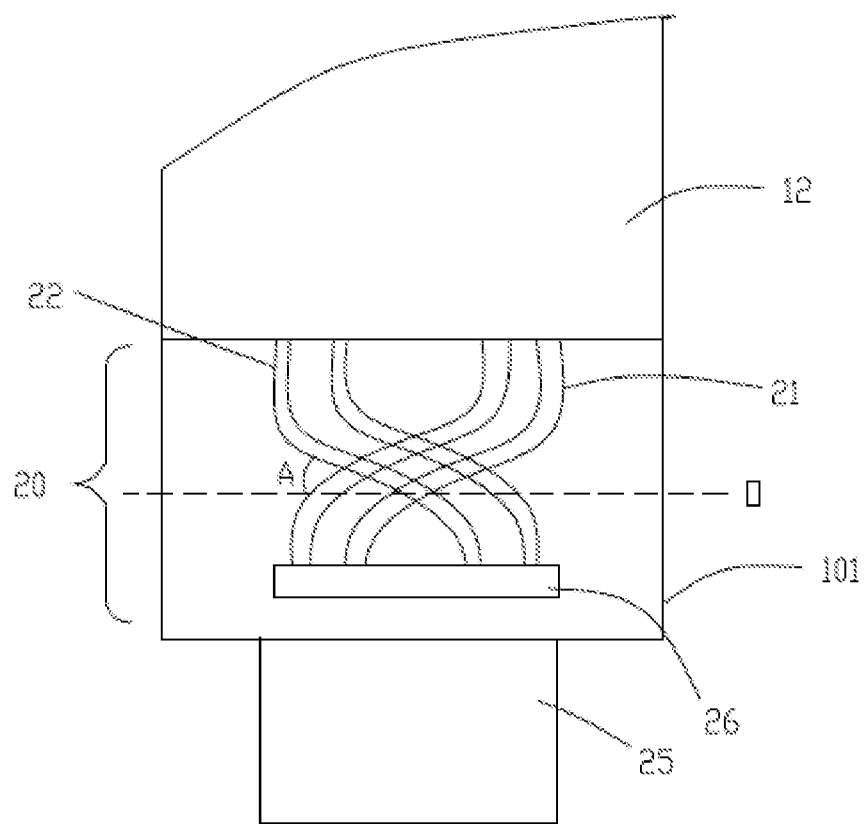
FIG. 3 is a plan view diagram of a trace structure of an OLED display panel shown in FIG. 2.

As shown in FIG. 2 and FIG. 3, the trace structure of the OLED display panel comprises an outer lead region 20. The outer lead region 20 is an extending end of the substrate. At least two metal trace layers which are mutually insulated are disposed on the outer lead region 20. In this embodiment, two metal trace layers are illustrated for explanation. The two metal trace layers are a metal trace layer 21 and a metal trace layer 22. A bending region is configured to the outer lead region 20. Traces of the two metal trace layers 21, 22 and a center line O of the bending region are arranged with a non-orthogonal included angle A (in FIG. 3) and the two metal trace layers connect the OLED display panel with external electrical signals.

In other embodiments, the metal trace layers which are mutually insulated can be three layers and configured to be overlapped. The three layers are insulated with insulation layers. Certainly, metal trace layers can be four layers to be insulated with insulation layers. It is within the scope of the present invention to design multiple metal trace layers according to design requirements without affecting the bending of the outer lead region 20.

As shown in FIG. 2, furthermore, each of the metal trace layers can be formed with a plurality of metal lines which are spaced from one another. The metal trace layer 21 and the metal trace layer 22 are arranged in a thickness direction of the OLED display panel and are insulated by an insulation layer 23. Both the traces of the metal trace layer 21 and the metal trace layer 22 are led out from the two OLED light emitting layers 12 or are led out from the same layer and then are layered through vias. In this embodiment, the metal trace layer 21 is under the metal trace layer 22. The traces of the metal trace layer 22 are disposed on the surface of the insulation layer 23 through the vias passing through the insulation layer 23. Specifically, the array substrate 10 comprises a TFT (thin film transistor) switch 101 and a gate insulation layer 102 formed on the substrate 101. The first metal trace layer (metal trace layer 21) is arranged on the gate insulation layer 102 of the outer lead region 20. The second metal trace layer (metal trace layer 22) is arranged on the insulation layer 23 covering the first metal trace layer of the outer lead region 20. The trace widths of the metal trace layer 21 and the metal trace layer 22 are 8 to 10 µm. The pitches of the traces are 10 to 12 µm. The trace widths of the metal trace layer 21 increase. The resistance of the electrical signals will decrease, correspondingly.

As shown in FIG. 3, projections of the traces of the two metal trace layers in the outer lead region 20 intersect but not completely overlap and an intersecting position is at two sides of the center line O of the bending region or on the center line O of the bending region. As shown in FIG. 3, the traces of the metal trace layer 21 are extended from a driver chip and then, are bent to the right to continue extending and the traces of the metal trace layer 22 are extended from the driver chip and then, are bent to the left to continue extending. For projections in the outer lead region 20, the bending directions of the traces of the two metal trace layers are different, so the traces of the upper layer and the traces of the lower layer intersect in their projections. Certainly, as going to arrange a plurality of traces, the traces of each layer can be distributed in the entire area of the layer. Thus, the layout of the metal traces in the outer lead region 20 of the present invention can increase the trace width and the pitch between two traces. Meanwhile, the stress of the unit length is decreased to ensure the yield of the metal traces for transmitting the electrical signals. When a plurality of traces is required, the same trace width and the pitch as prior art can be achieved but the traces of one more whole layer than prior art are provided and can be flexibly utilized.

The array substrate 10, the OLED light emitting layer 12, the polarizer 13 and the glass cover plate 14 of the OLED display panel according to the present invention are sequentially overlapped. The OLED light emitting layer 12 further comprises TFT (thin film transistor) package layer 16. The OLED display panel controls the intensity of light emitted by the OLED light emitting layer 12 with the current. The external light is easily reflected back to the OLED display panel and may affect the contrast. The polarizer 13 can solve this issue to ensure the display quality of the OLED display panel. The TFT package layer 16 possesses the water-oxygen barrier property that can prevent the external water and vapor from polluting the TFT switches.

As shown in FIG. 1, the OLED display panel further comprises a flexible circuit board 25. The flexible circuit board 25 is connected to the outer lead region 20 and is coupled to the OLED light emitting layer 12 via a portion of the traces of the metal trace layers. The flexible circuit board 25 is installed in the outer lead region 20 by welding or inserting. A chip device 26 is further arranged in the outer lead region 20. The chip device 26 is coupled to the OLED light emitting layer 12 via a portion of the traces of the metal trace layers.

Figure 4:
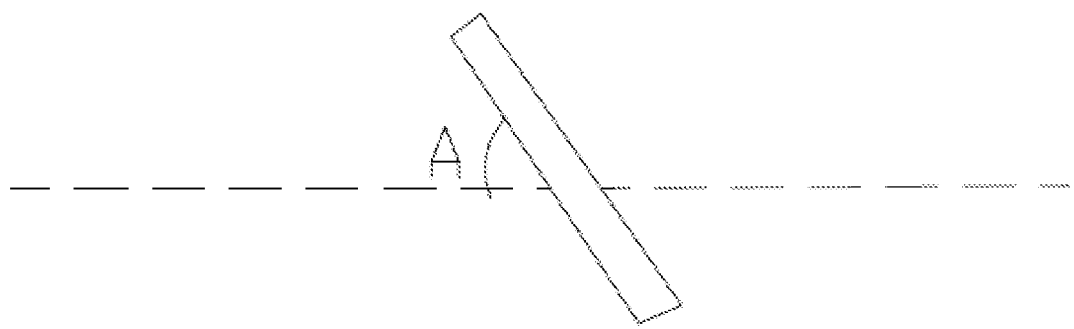
FIG. 4 is a diagram of traces and a bending center line of a trace structure of an OLED display panel shown in FIG. 3.

During the package or the case assembly of the OLED display panel, the outer lead region 20 is bent toward the back side of the array substrate 10 along the center line of the bending region. The bent state of the metal traces is relevant with the bending degree. The bending degree is expressed by a radius r of curvature. The smaller r is, the greater the bending degree is. The included angle A of the traces of the two metal trace layers and the center line of the bending region is a non-orthogonal angle. As shown in FIG. 4, then as the traces are bent with the substrate, the bent direction of the traces is inclined as a thread. Once the trace contact area is increased to reduce the stress of the unit length, the direct stress to the traces can be reduced, accordingly. With the reasonable layout of the entire traces, the impedance can be reduced to promote the anti-bending performance of the traces in the outer lead region. Thus, the technical problem that a metal trace layer is broken when an outer lead region is bent can be solved.

The present invention further provides an OLED display device, comprising the OLED display panel.

The above provides only specific embodiments of the present invention and the scope of the present invention is not limited thereto. Persons who are skilled in the art, change or replacement which is easily derived should be covered by the protected scope of the invention. Thus, the protected scope of the invention should be determined according to the appended claims only.

What is claimed is:

1. A trace structure of an organic light emitting diode display panel, wherein the organic light emitting diode display panel comprises an array substrate that comprises an organic light emitting diode light emitting layer and an outer lead region that is different from and located outside the organic light emitting diode light emitting layer, the trace structure comprising two metal trace layers that are disposed in the outer lead region of the array substrate, wherein the two metal trace layers are mutually insulated from each other, and a bending region is configured in the outer lead region, such that traces of the two metal trace layers and a center line of the bending region are arranged with a non-orthogonal included angle, and wherein the two metal trace layers of the trace structure are arranged in the outer lead region and outside the organic light emitting diode light emitting layer to connect the organic light emitting diode light emitting layer to an external electrical signal that is supplied from an external device mounted to the outer lead region of the array substrate, wherein a first metal trace layer of the two metal trace layers comprises traces extending from a starting point designated at the external device to an ending point designated at the organic light emitting diode light emitting layer and a second metal trace layer of the two metal trace layers comprises traces extending from a starting point designated at the external device to an ending point designated at the organic light emitting diode light emitting layer, wherein each of the traces of the first and second metal trace layers casts a projection on the array substrate in the outer lead region such that the projection of each of the traces of the first metal trace layer forms a single intersection with the projection of each of the traces of the second metal trace layer.

2. The trace structure of the organic light emitting diode display panel according to claim 1, wherein the two metal trace layers are arranged in a thickness direction of the organic light emitting diode display panel and are insulated by an insulation layer located between the two trace layers.

3. The trace structure of the organic light emitting diode display panel according to claim 1, wherein the array substrate comprises a TFT (thin film transistor) switch and a gate insulation layer formed on the array substrate and having a portion located in the outer lead region, and wherein the first metal trace layer of the two metal trace layers is arranged on the portion of the gate insulation layer that is located in the outer lead region, and the second metal trace layer of the two metal trace layers is arranged on an insulation layer that is located on and covers the first metal trace layer.

4. The trace structure of the organic light emitting diode display panel according to claim 1, wherein the projections of the traces of the two metal trace layers intersect but do not completely overlap and a position of the intersection between the projection of each of the traces of the first metal trace layer and the projection of each of the traces of the second metal trace layer is at two sides of the center line of the bending region or on the center line of the bending region.

5. An organic light emitting diode display panel, comprising an array substrate comprising an organic light emitting diode light emitting layer, a polarizer, and a glass cover plate arranged on the organic light emitting diode light emitting layer, and an outer lead region that is different from and located outside the organic light emitting diode light emitting layer, a trace structure comprising two metal trace layers that are disposed in the outer lead region of the array substrate, wherein the two metal trace layers are mutually insulated from each other, and a bending region is configured in the outer lead region, such that traces of the two metal trace layers and a center line of the bending region are arranged with a non-orthogonal included angle, and wherein the two metal trace layers of the trace structure are arranged in the outer lead region and outside the organic light emitting diode light emitting layer to connect the organic light emitting diode light emitting layer to an external electrical signal that is supplied from an external device mounted to the outer lead region of the array substrate, wherein a first metal trace layer of the two metal trace layers comprises traces extending from a starting point designated at the external device to an ending point designated at the organic light emitting diode light emitting layer and a second metal trace layer of the two metal trace layers comprises traces extending from a starting point designated at the external device to an ending point designated at the organic light emitting diode light emitting layer, wherein each of the traces of the first and second metal trace layers casts a projection on the array substrate in the outer lead region such that the projection of each of the traces of the first metal trace layer forms a single intersection with the projection of each of the traces of the second metal trace layer.

6. The organic light emitting diode display panel according to claim 5, wherein the two metal trace layers are arranged in a thickness direction of the organic light emitting diode display panel and are insulated by an insulation layer located between the two trace layers.

7. The organic light emitting diode display panel according to claim 5, wherein the array substrate comprises a TFT switch and a gate insulation layer formed in the array substrate and having a portion located in the outer lead region, and wherein the first metal trace layer of the two metal trace layers is arranged on the portion of the gate insulation layer that is located in the outer lead region, and the second metal trace layer of the two metal trace layers is arranged on an insulation layer that is located on and covers the first metal trace layer.

8. The organic light emitting diode display panel according to claim 5, wherein the projections of the traces of the two metal trace layers intersect but not completely overlap and a position of the intersection between the projection of each of the traces of the first metal trace layer and the projection of each of the traces of the second metal trace layer is at two sides of the center line of the bending region or on the center line of the bending region.

9. The organic light emitting diode display panel according to claim 5, wherein the external device mounted to the outer lead region of the array substrate comprises a flexible circuit board, which is connected to the organic light emitting diode light emitting layer via the metal trace layers.

10. The organic light emitting diode display panel according to claim 5, wherein the external device mounted to the outer lead region of the array substrate comprises a chip and the metal trace layers of the trace structure is connected between the organic light emitting diode light emitting layer and the chip.

11. An organic light emitting diode display device comprising an organic light emitting diode display panel, wherein the organic light emitting diode display panel comprises an array substrate having a first area and a second area different from the first area, comprising an organic light emitting diode light emitting layer, a polarizer, and a glass cover plate arranged on the organic light emitting diode lighting layer, and an outer lead region that is different from and located outside the organic light emitting diode light emitting layer, a trace structure comprising two metal trace layers that are disposed in the outer lead region of the array substrate, wherein the two metal trace layers are mutually insulated from each other, and a bending region is configured in the outer lead region, such that traces of the two metal trace layers and a center line of the bending region are arranged with a non-orthogonal included angle, and wherein the two metal trace layers of the trace structure are arranged in the outer lead region and outside the organic light emitting diode light emitting layer to connect the organic light emitting diode light emitting layer to an external electrical signal that is supplied from an external device mounted to the outer lead region of the array substrate, wherein a first metal trace layer of the two metal trace layers comprises traces extending from a starting point designated at the external device to an ending point designated at the organic light emitting diode light emitting layer and a second metal trace layer of the two metal trace layers comprises traces extending from a starting point designated at the external device to an ending point designated at the organic light emitting diode light emitting layer, wherein each of the traces of the first and second metal trace layers casts a projection on the array substrate in the outer lead region such that the projection of each of the traces of the first metal trace layer forms a single intersection with the projection of each of the traces of the second metal trace layer.

12. The organic light emitting diode display device according to claim 11, wherein the two metal trace layers are arranged in a thickness direction of the organic light emitting diode display panel and are insulated by an insulation layer located between the two trace layers.

13. The organic light emitting diode display device according to claim 11, wherein the array substrate comprises a TFT switch and a gate insulation layer formed in the array substrate and having a portion located in the outer lead region, and wherein the first metal trace layer of the two metal trace layers is arranged on the portion of the gate insulation layer that is located in the outer lead region, and the second metal trace layer of the two metal trace layers is arranged on an insulation layer that is located on and covers the first metal trace layer.

14. The organic light emitting diode display device according to claim 11, wherein the projections of the traces of the two metal trace layers intersect but not completely overlap and a position of the intersection between the projection of each of the traces of the first metal trace layer and the projection of each of the traces of the second metal trace layer is at two sides of the center line of the bending region or on the center line of the bending region.

15. The organic light emitting diode display device according to claim 11, wherein the external device mounted to the outer lead region of the array substrate comprises a flexible circuit board, which is connected to the organic light emitting diode light emitting layer via the metal trace layers.

16. The organic light emitting diode display device according to claim 11, wherein the external device mounted to the outer lead region of the array substrate comprises a chip and the metal trace layers of the trace structure is connected between the organic light emitting diode light emitting layer and the chip.

* * * * *